United States Patent [19]

Schreck et al.

[11] Patent Number: 5,182,726
[45] Date of Patent: Jan. 26, 1993

[54] CIRCUIT AND METHOD FOR DISCHARGING A MEMORY ARRAY

[75] Inventors: John F. Schreck; Phat C. Truong, both of Houston, Tex.

[73] Assignee: Texas Instruments Incorporated, Dallas, Tex.

[21] Appl. No.: 645,078

[22] Filed: Jan. 23, 1991

[51] Int. Cl.$^5$ ............................................. G11C 11/40
[52] U.S. Cl. ..................................... 365/203; 365/182
[58] Field of Search .................... 365/182, 189.01, 203, 365/148

[56] References Cited

U.S. PATENT DOCUMENTS 5,075,891 12/1991 Yano et al. .......................... 365/203
5,083,047 1/1992 Horie et al. .......................... 365/203

Primary Examiner—Terell W. Fears
Attorney, Agent, or Firm—Theodore D. Lindgren; Leo H. Heiting; Richard L. Donaldson

[57] ABSTRACT

A circuit and method for rapid removal of drain-column programming voltages from drain-column lines of a memory array. The circuit includes a resistor/transistor connected between a supply voltage and a common node, the resistor/transistor being enabled by a program enable signal. During the discharge operation, the source-drain paths of a driver transistors of the array connect column lines to reference potential. The gates of the driver transistors are coupled to the common node. An enabling transistor has a source-drain path connecting reference potential to the common node and has a gate connected to the program enable signal. The circuit includes at least one inverter, an OR circuit, and a bypass transistor. The bypass transistor has a source-drain path connected between the supply voltage and the common node and a gate coupled to the common node through the inverter and the OR circuit. The common node may be coupled to the gate of the driver transistor by a coupling transistor having a source-drain path connected between the common node and the gate of the driver transistor and a gate connected to a virtual ground signal.

18 Claims, 4 Drawing Sheets

ADDRESS INPUT

| PRE-DECODER | | | | | | |
|---|---|---|---|---|---|---|
| PROGRAM PATH | | | | | | |
| REDUNDANT ROWS | WORDLINE DECODER AND DRIVERS | REDUNDANT COLUMNS | REDUNDANT ROWS | REDUNDANT ROWS | WORDLINE DECODER AND DRIVERS | REDUNDANT ROWS |
| 512x512 MEMORY CELL ARRAY | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| 512x512 MEMORY CELL ARRAY | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| VIRTUAL GROUND DECODER | COLUMN DECODER | | VIRTUAL GROUND DECODER | VIRTUAL GROUND DECODER | COLUMN DECODER | VIRTUAL GROUND DECODER |
| SENSE AMPS | | | SENSE AMPS | SENSE AMPS | | SENSE AMPS |

DATA INPUT/OUTPUT

*Fig. 1*

CIRCUIT AND METHOD FOR DISCHARGING A MEMORY ARRAY

BACKGROUND OF THE INVENTION

This invention relates to integrated-circuit memory arrays, including electrically-programmable, read-only-memory (EPROM) arrays, and to circuitry and methodology for discharging charged column lines of such arrays.

An EPROM array is one example of an integrated circuit in which the circuit and method of this invention may be used. EPROM arrays include floating-gate memory cells arranged in rows and columns. The floating gate of a programmed memory cell is charged with electrons, and the electrons in turn render the source-drain path under the charged floating gate nonconductive when a chosen row-line select voltage is applied to the control gate. The nonconductive state is read as a "zero" bit. The floating gate of a non-programmed cell is neutrally charged such that the source-drain path under the non-programmed floating gate is conductive when the same chosen row-line select voltage is applied to the control gate. The conductive state is read as a "one" bit.

Each column and row of an EPROM array may contain thousands of cells. The sources of each cell in a column are connected to a virtual-ground line (source-column line). The drains of each cell in a column are connected to a separate bitline (drain-column line). The control gates of each cell in a row are connected to a wordline.

During cell programming, appropriate programming voltages are applied to the selected control-gate wordline and the selected source-column line to create a high-current condition in the selected channel region, injecting channel-hot electrons and/or avalanche-breakdown electrons across the channel oxide to the floating gate. The relatively high programming voltage applied to the selected drain-column line must be removed from the selected drain-column line after programming and prior to reading the selected cell to verify the programmed state. The removal of the voltage should be accomplished rapidly to minimize programming time. However, if sufficient time is not allowed for removal of the voltage, an improperly programmed memory cell will be erroneously detected as a "zero".

In virtual-ground-type arrays, the drain-column discharge problem is made more difficult because the size of the drain-column-line capacitance depends on the column selected and on the previously defined data pattern. Since a virtual-ground-type array is a series combination of N-type enhancement memory cells having common control gates, all of the drain-column lines and source-column lines (sometimes referred to as virtual-ground lines) emanating from a drain-column line driven to high voltage may themselves be charged to high voltage via the series connections. As the number of charged drain-column lines and/or source column lines increases, the amount of charge, and the time to discharge that charge, increases.

U.S. Pat. No. 4,797,857 describes a discharge method for an equalized biased array. The method disclosed in that Patent involves use of a large static N-channel transistor load to discharge the array through drain-column-line transistor loads and source-column-line N-channel transistor loads. A circuit detects when the array is discharged, then turns off the large discharge transistor. The method disclosed in that Patent cannot be used with bias circuitry such as that described in co-pending U.S. Pat. No. 5,132,933. The bias circuitry described in that Patent biases only the drain-column line connected to the sense amplifier and the source-column line connected to the cell that shares the same drain-column line and the same word line as the cell. Individual loads are not connected to each drain-column line and/or source-column line and, therefore, an alternate discharge path is required.

Where such individual loads are not present, there is a need for a circuit and method to remove drain-column programming voltages from selected drain-column lines rapidly in order to minimize programming and verification times and to minimize errors in verification reading.

SUMMARY OF THE INVENTION

The circuitry and method of this invention accomplish rapid removal of programming voltages from column lines of a memory array, such as a memory array having bias circuitry similar to that of U.S. Pat. No. 5,132,933.

The circuit includes a resistor/transistor connected between a supply voltage and a common node, the resistor/transistor being enabled by a program enable signal. During the discharge operation, the source-drain paths of driver transistors of the array connect the source-column lines to reference potential. The gates of the driver transistors are coupled to the common node. An enabling transistor has a source-drain path connecting reference potential to the common node and has a gate connected to the program enable signal. The circuit includes an inverter, an OR circuit, and a bypass transistor. The bypass transistor has a source-drain path connected between the supply voltage and the common node and a gate coupled to the common node through the inverter and the OR circuit. The common node may be coupled to the gate of the driver transistor by a coupling transistor having a source-drain path connected between the common node and the gate of the driver transistor and a gate connected to a virtual ground signal.

BRIEF DESCRIPTION OF THE DRAWINGS

In the drawings:

FIG. 1 is a representation of an integrated circuit layout for a four-megabit EPROM array;

DETAILED DESCRIPTION OF THE SPECIFIC EMBODIMENT

Referring to FIG. 1, an example of an integrated circuit layout for a nominal four-megabit EPROM is illustrated. The layout, in which dimensional proportions are not those of actual manufacture, illustrates sixteen 512×512 memory sub-arrays with redundant rows and columns used to replace rows and columns having defective cells. Peripheral circuitry, including wordline decoders, column decoders, virtual-ground decoders, wordline drivers, and column/segment pass gates, all of which function to connecting reading and programming voltages to the rows and columns of cells in response to address inputs routed through a pre-decoder and program path. Data are written into the memory arrays during programming operations. During reading operations, data from the memory arrays are routed through sense amplifiers to the output.

Figure 2:
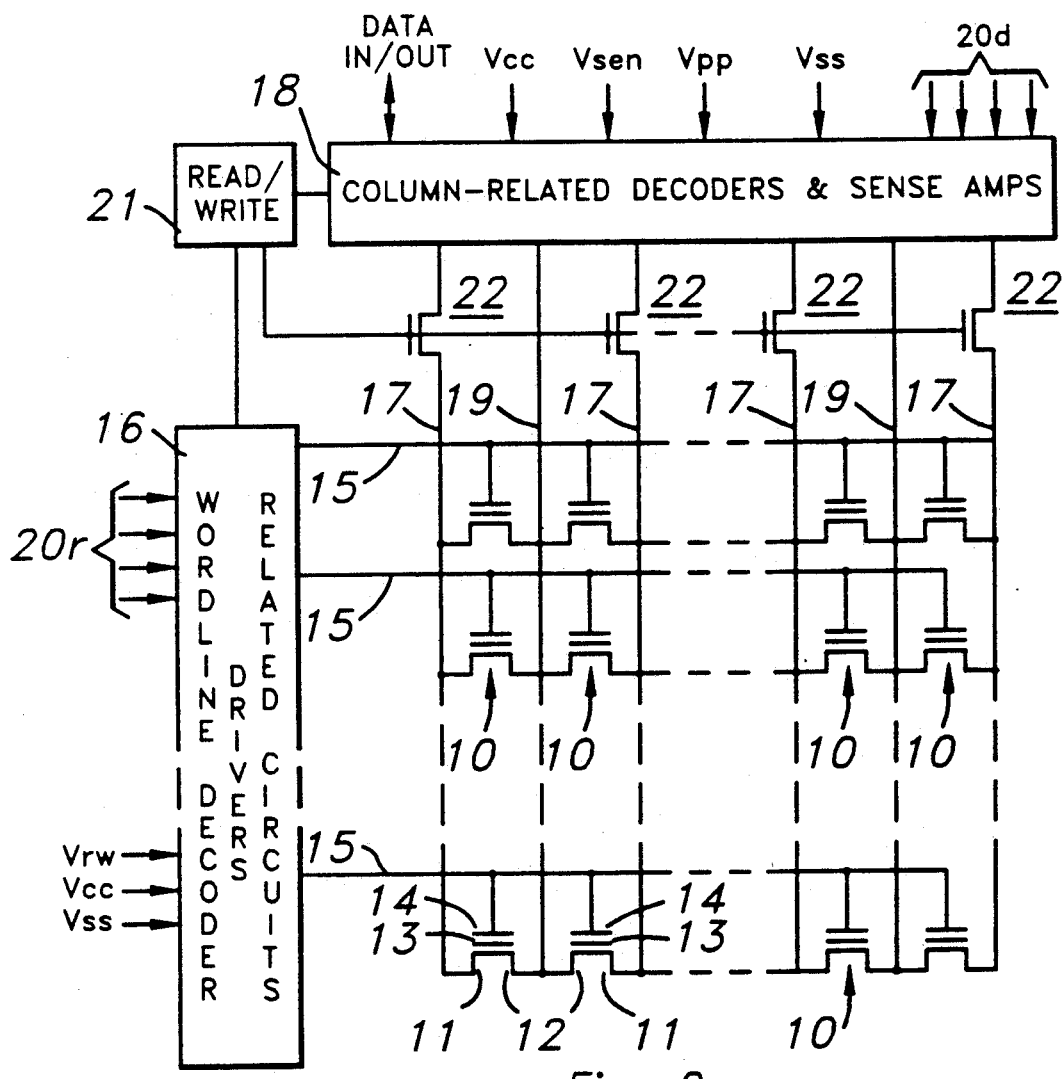
FIG. 2 is a representation of a part of a memory cell array and associated circuitry of the integrated circuit of FIG. 1.

Referring to FIG. 2, an example array of memory cells, which is a part of a memory chip such as that illustrated in FIG. 1, is shown. Each cell is a floating-gate transistor 10 having a source 11, a drain 12, a floating gate 13 and a control gate 14. Each of the control gates 14 in a row of cells 10 is connected to a wordline 15 (or row line 15), and each of the wordlines 15 is connected to a wordline circuit 16, which includes wordline decoders, drivers and related circuitry. Each of the sources 11 in a column of cells 10 is connected to a source-column line 17 (which may be a virtual-ground line), and each of the source-column lines 17 is connected through a driver transistor 22 to a column circuit 18, which includes column/segment decoders, virtual ground decoders and column/segment pass gates. Each of the drains 12 in a column of cells 10 is connected to a drain-column line 19, and each of the drain-column lines 19 is connected to the column circuit 18.

In a write or program mode, the wordline circuit 16 may function, in response to wordline address signals on lines 20r and to signals from Read/Write control circuit 21, (or a microprocessor 21) to place a preselected first programming voltage Vpp (approx. +12.5V) on a selected wordline 15, including a selected control-gate conductor 14. Read/Write control circuit 21 also controls the voltage on the gates of driver transistors 22. Column circuit 18 also functions to place a second programming voltage Vrw (Vpp reduced through an impedance to approx. +5 to +10V) on a selected source-column line 17 and, therefore, the source 11 of selected cell 10. The selected drain-column line 19 is connected to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately $-2V$ to $-6V$ with respect to the channel region. The injected electrons and negative voltage in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, the wordline circuit 16 functions, in response to wordline address signals on lines 20r and to a signal from Read/Write control circuit 21, to apply a preselected positive voltage Vcc (approx. +3 to +5 volts) to the selected wordline 15 (and the selected control gate 14), and to apply a low voltage (ground or Vss) to deselected wordlines 15. The column circuit 18 functions, in response to column address signals on lines 20d, , causes a sense amplifier to apply a preselected positive voltage Vsen (approx. +1 to +1.5 volts) to the selected drain-column line 19. The column circuit 18 also functions to connect all of the source-column lines 17 to ground (or Vss) except for the source-column line 17 sharing the same drain-column line connected to the cell 10 that is being read. That source-column line 17 is driven to the same voltage level as the selected drain-column line. The conductive or nonconductive state of the cell 10 connected to the selected drain-column line 19 and the selected wordline 15 is detected by a sense amplifier connected to the DATA OUT terminal. As is well-known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable.

Figure 3:
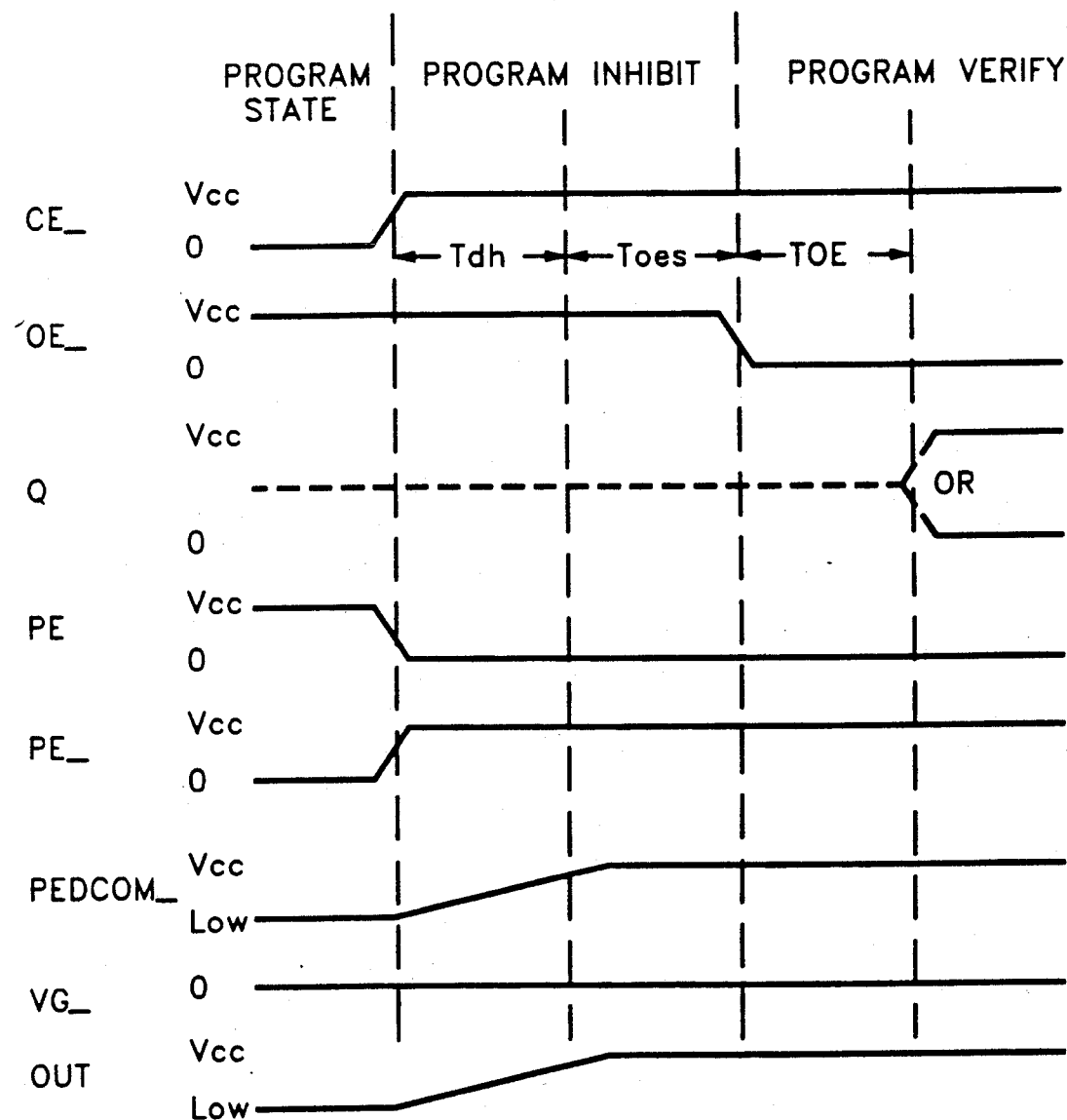
FIG. 3 is a representation of a timing diagram for the integrated circuit of FIGS. 1 and 2.

FIG. 3 illustrates the timing sequence after programming a selected cell of the example EPROM. The symbols in FIG. 3 are defined in Table I below:

TABLE I

| | | |
|---|---|---|
| CE_ | = | inverse of Chip Enable signal |
| OE_ | = | inverse of Output Enable signal |
| Q | = | Input/Output pin signal |
| Tdh | = | Data Hold Time |
| Toes | = | Output Enable Setup Time |
| Toe | = | Access Time from Output Enable |
| PE | = | Program Enable signal |
| PE_ | = | inverse of Program Enable signal |
| PEDCOM_ | = | output of control circuit |
| VG_ | = | low signal during program mode of operation |
| OUT | = | signal at gate of source-column-line driver transistor 22 |

Typically, Tdh (Data Hold Time) is specified to be approximately 2 microseconds, Toes (Output Enable Setup Time) is specified to be approximately 2 microseconds and Toe (Access Time from Output Enable) is specified to be approximately 150 nanoseconds. The period during which the array must be discharged is the Program Inhibit time interval, which is defined above to be approximately 4 microseconds. The access time, measured after the inverse output enable OE_ is toggled low, occurs at the start of the Program Verify operation. In virtual-ground-type arrays, the discharge problem is made more difficult because the capacitance may be larger than expected. The size of the capacitance depends on the column line selected and on the previously defined data pattern. Because a virtual-ground-type array is a series combination of N-type enhancement memory cells 10 having commonly connected control gates 13, all of the floating drain-column lines 19 and the floating source-column lines 17 (sometimes referred to as virtual-ground lines) connected via the series connections to a source-column line 19 that is driven to high voltage may themselves be charged to high voltage. As the number of charged drain-column lines 19 and/or source-column lines 17 increases, both the amount of charge and the time to discharge that charge increase.

One characteristic of the biasing circuitry described in U.S. Pat. No. 5,132,933 is that all of the source-column lines 17 are grounded when not in the programming mode, except for the source-column line 17 connected to the cell 10 that shares the same drain-column line 19 and the same word line 15 as the selected cell 10.

Another aspect of the biasing circuitry described in the Patent Application referenced above is that, because of the segmented architecture, the source-column lines 17 have approximately four times the capacitance of the segmented drain-column lines 19. (The architecture is such that the source-column lines 17 are common to four array segments, each array segment having separate drain-column lines 19.) The biasing circuitry is such that the drain-column lines 19 in the deselected segments are not charged and, therefore, do not require discharging. Therefore, if the source-column lines 17 can be discharged during the Program Inhibit time interval (Tdh+Toes), then the segment of the array being read will be discharged sufficiently during that time interval. If the selected drain-column line 19 needs to be discharged, the discharge will be accomplished by the bleeder circuitry described in co-pending U.S. Pat. No. 5,132,933. The bleeder path described that Patent Application is a combination of very resistive N-channel devices connecting all of the drain-column lines 19 and source-column lines 17 to a common node. With most of the source-column lines 17 discharged to ground, a relatively high-resistance discharge path exists from the drain-column lines 19 to the common node and to ground through the source-column line driver transistors 22. Also, if the cell 10 to be read during a Program Verify operation is a conducting cell, then that cell 10 will also aid in discharging the drain-column line 19.

The above bleeder-discharging circuitry has been described in U.S. Pat. No. 5,132,933. Using the circuitry of that Patent Application, the source-column lines 17 are discharged to reference potential Vss through driver transistors 22. The driver transistors 22 are large and are, therefore, capable of conducting large currents. However, these large currents may combine to form a large spike in the current to reference potential Vss during discharge if many source-column lines 17 are discharged at one time.

Figure 4:
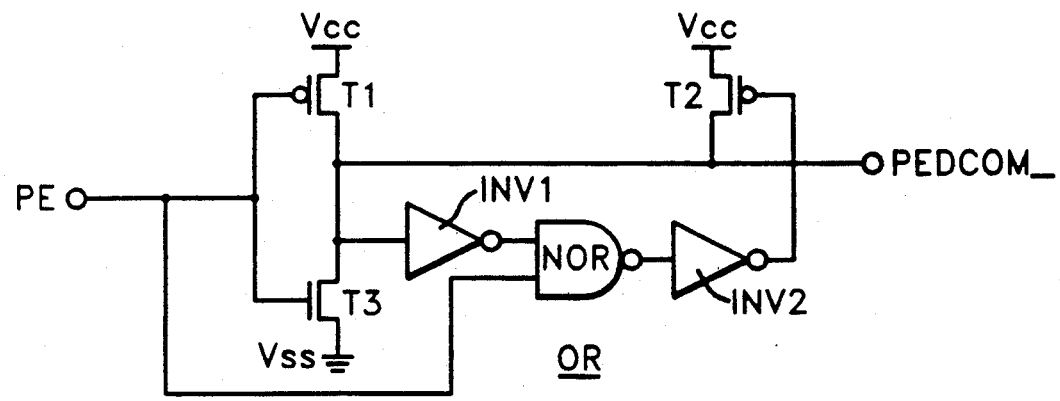
FIG. 4 is a schematic representation of a circuit for controlling the discharge rate of current during discharge of drain-column lines.
Figure 5:
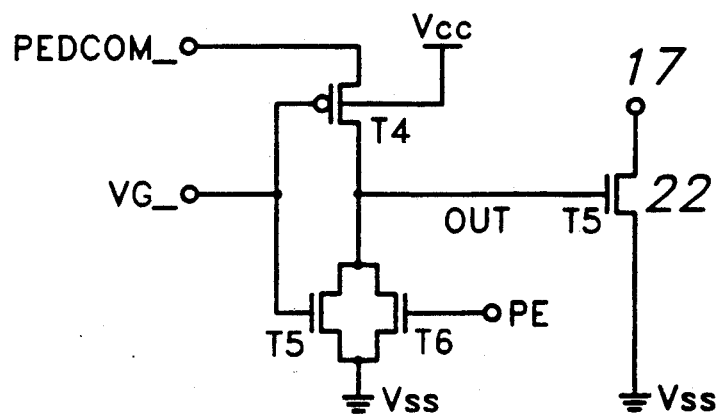
FIG. 5 is a schematic representation illustrating application of the output of the circuit of FIG. 4 to a column-line driver transistor.

Referring now to FIGS. 4 and 5, the circuits illustrated therein control the rate of current to reference potential Vss during column-line discharge operation. The circuit of FIG. 4 uses a high impedance P-channel transistor T1 to slowly increase the amount of current the source-column line driver transistors 22 will conduct. N-channel transistor T3 has a low resistance compared to the resistance of P-channel transistor T1. Transistor T3 is constructed using the normal parameters and dimensions used for construction of N-channel transistors elsewhere on the memory chip. The P-channel transistor T1 is formed to have a sufficiently high resistance that, as the source-column lines 17 are discharging, the large amount of drain-to-gate capacitance on each of the source-column driver transistors 22 couples the common node PEDCOM_ to a lower voltage and, therefore, reduces the drive voltage on the source-column line driver transistors 22. This coupling effect serves as a form of active feedback so that, as the portion of array that needs to be discharged changes, the discharge rate changes to help maintain a sufficiently low spike in the current to reference potential Vss during discharge.

In addition to being affected by the changing portion of the array requiring discharge, the rate of discharge is also affected by the size of the P-channel transistor T1. If the P-channel transistor T1 is made more conductive, the feedback will be less effective.

Also included in the circuit of FIG. 4 is a large P-channel transistor T2 which provides a path for large currents after the array has been discharged. The signal at the PEDCOM_ node controls whether or not T2 is turned on. At the beginning of Program Inhibit signal, the signal at the PEDCOM_ node starts at a low voltage and the voltage rises slowly as the array is discharged. After the voltage at the PEDCOM_ node reaches the trip point of INV1, T2 is turned on and the voltage at the PEDCOM_ node is then driven strongly to Vcc.

FIG. 5 illustrate how the signal at the PEDCOM_ node is coupled to the gate of an example source-column line driver transistor 22. Transistors T4, T5 and T6 enable and disable transmission of the voltage at the PEDCOM_ node to the gate of driver transistor 22.

Referring again to FIGS. 4 and 5, a resistor T1 is connected between a supply voltage Vcc and a common node PEDCOM_, the resistor T1 being enabled by a program enable signal PE. During the discharge operation, at least one driver transistor 22 of a first conductivity-type has a source-drain path connected between a column line 17 of the array and reference potential Vss. The gate of the driver transistor 22 is coupled to the common node PEDCOM_. An enabling transistor T3 of the first conductivity-type has a source-drain path between reference potential Vss and the common node PEDCOM_. The gate of the enabling transistor T3 is connected to the program enable signal PE. The circuit may include an inverter INV, an OR circuit (shown as a NOR circuit and an inverter), and a bypass transistor T2 of a second conductivity-type. The bypass transistor T2 has a source-drain path connected between the supply voltage Vcc and the common node PEDCOM_. The gate of the bypass transistor T2 is coupled to the common node through the inverter INV and the OR circuit. The program enable signal PE is also coupled to the OR circuit. The circuit may include a first transistor T5 of the first conductivity-type, the first transistor having a source-drain path connected between the gate of the driver transistor 22 and reference potential Vss. The gate of the first transistor T5 is connected to an inverse virtual ground signal VG_. The circuit may also include a second transistor T6 of the first conductivity-type, the second transistor T6 having a source-drain path connected between the gate of the driver transistor 22 and reference potential Vss. The gate of the second transistor T6 is connected to the program enable signal PE. The resistor may be a third transistor T1 of the second conductivity-type, the third transistor T1 having a source-drain path connected between the supply voltage Vss and the common node PEDCOM_. The gate of the third transistor T1 is connected to the program enable signal PE. The resistor T1, or the source-drain path of the third transistor T1, has a larger resistance than the source-drain path of the driver transistor 22. The common node PEDCOM_ may be coupled to the gate of the driver transistor 22 by a fourth transistor T4 of the second conductivity-type, the fourth transistor T4 having a source-drain path connected between the common node PEDCOM_ and the gate of the driver transistor 22. The gate of the fourth transistor T4 is connected to an inverse virtual ground signal VG_.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A circuit for discharging column lines of a memory array, comprising:
   a resistor, said resistor connected between a supply voltage and a common node, said resistor enabled by a program enable signal; and
   at least one driver transistor of a first conductivity-type, said driver transistor having a source-drain path and a gate, said source-drain path of said driver transistor connected between a said column line and reference potential, said gate of said driver transistor coupled to said common node.

2. The circuit of claim 1, wherein said resistor is a transistor of a second conductivity-type, said second conductivity-type transistor having a source-drain path and a gate, said source-drain path of said second conductivity-type transistor connected between a supply voltage and a common node, said gate of said second conductivity-type transistor connected to said program enable signal.

3. The circuit of claim 1, including:
   an enabling transistor of said first conductivity-type, said enabling transistor having a source-drain path and a gate, said source-drain path of said enabling transistor connected between said reference potential and said common node, said gate of said enabling transistor connected to said program enable signal.

4. The circuit of claim 1, wherein said resistance of said resistor is larger than the resistance of said source-drain path of said driver transistor.

5. The circuit of claim 1, wherein said driver transistor is a N-channel transistor.

6. The circuit of claim 1, including at least one inverter, an OR circuit, and a bypass transistor of a second conductivity-type, said bypass transistor having a source-drain path and a gate, said source-drain path of said bypass transistor connected between said supply voltage and said common node, said gate of said bypass transistor coupled to said common node through said at least one inverter and said OR circuit, said program enable signal coupled to said OR circuit.

7. The circuit of claim 1, wherein said common node is coupled to said gate by a first transistor of a second conductivity-type, said first transistor having a source-drain path and a gate, said source-drain path of said first transistor connected between said common node and said gate of said driver transistor, said gate of said first transistor connected to a virtual ground signal.

8. The circuit of claim 1, including a first transistor of said first conductivity-type, said first transistor having a source-drain path and a gate, said source-drain path of said first transistor connected between said gate of said driver transistor and said reference potential, said gate of said first transistor connected to a virtual ground signal.

9. The circuit of claim 1, including a first transistor of said first conductivity-type, said first transistor having a source-drain path and a gate, said source-drain path of said first transistor connected between said gate of said driver transistor and said reference potential, said gate of said first transistor connected to said program enable signal.

10. A circuit for discharging column lines of a memory array, comprising:
    a resistor, said resistor connected between a supply voltage and a common node, said resistor enabled by a program enable signal;
    at least one driver transistor of a first conductivity-type, said driver transistor having a source-drain path and a gate, said source-drain path of said driver transistor connected between a said column line and reference potential, said gate of said driver transistor coupled to said common node;
    an enabling transistor of said first conductivity-type, said enabling transistor having a source-drain path and a gate, said source-drain path of said enabling transistor connected between said reference potential and said common node, said gate of said enabling transistor connected to said program enable signal;
    at least one inverter, an OR circuit, and a bypass transistor of a second conductivity-type, said bypass transistor having a source-drain path and a gate, said source-drain path of said bypass transistor connected between said supply voltage and said common node, said gate of said bypass transistor coupled to said common node through said at least one inverter and said OR circuit, said program enable signal coupled to said OR circuit;
    a first transistor of said first conductivity-type, said first transistor having a source-drain path and a gate, said source-drain path of said first transistor connected between said gate of said driver transistor and said reference potential, said gate of said first transistor connected to a virtual ground signal; and
    a second transistor of said first conductivity-type, said second transistor having a source-drain path and a gate, said source-drain path of said third transistor connected between said gate of said driver transistor and said reference potential, said gate of said second transistor connected to said program enable signal;
    wherein said resistor is a third transistor of said second conductivity-type, said third transistor having a source-drain path and a gate, said source-drain path of said third transistor connected between a supply voltage and a common node, said gate of said third transistor connected to said program enable signal;
    wherein said source-drain path of said third transistor has a larger resistance than said source-drain path of said driver transistor;
    wherein said driver transistor is a N-channel transistor; and
    wherein said common node is coupled to said gate of said driver transistor by a fourth transistor of said second conductivity-type, said fourth transistor having a source-drain path and a gate, said source-drain path of said fourth transistor connected between said common node and said gate of said driver transistor, said gate of said fourth transistor connected to said virtual ground signal.

11. A method for discharging charged column-lines of a memory array, comprising:
    in response to a program-enable signal, coupling a resistance between a supply voltage and the gates of driver transistors of a first conductivity-type, the source-drain paths of each said driver transistor connected between a said column-line and reference potential.

12. The method of claim 11, wherein said resistance is a first transistor of a second conductivity-type, said first transistor having a source-drain path and a gate, said source-drain path of said first transistor connected between a supply voltage and said common node, said gate of said first transistor connected to said program-enable signal.

13. The method of claim 11, wherein said resistance is coupled to said gates of said driver transistors by a circuit comprising:
   a resistor, said resistor connected between a supply voltage and a common node, said resistor enabled by a program enable signal;
   an enabling transistor of said first conductivity-type, said enabling transistor having a source-drain path and a gate, said source-drain path of said enabling transistor connected between a reference potential and said common node, said gate of said enabling transistor connected to said program enable signal; and
   said common node coupled to said gates of said driver transistors.

14. The method of claim 11, wherein said resistor has a larger resistance than the resistance of one of said source-drain paths of said driver transistors.

15. The method of claim 11, wherein said resistance is coupled to said gates of said driver transistors by a circuit comprising:
   a resistor, said resistor connected between a supply voltage and a common node, said resistor enabled by a program enable signal;
   an enabling transistor of said first conductivity-type, said enabling transistor having a source-drain path and a gate, said source-drain path of said enabling transistor connected between a reference potential and said common node, said gate of said enabling transistor connected to said program enable signal; and
   at least one inverter, an OR circuit, and a bypass transistor of a second conductivity-type, said bypass transistor having a source-drain path and a gate, said source-drain path of said bypass transistor connected between said supply voltage and said common node, said gate of said bypass transistor coupled to said common node through said at least one inverter and said OR circuit, said program enable signal coupled to said OR circuit;
   said common node coupled to said gates of said driver transistors.

16. The method of claim 11, wherein said resistance is coupled to said gates of said driver transistors by a circuit comprising:
   a resistor, said resistor connected between a supply voltage and a common node, said resistor enabled by a program enable signal;
   an enabling transistor of said first conductivity-type, said enabling transistor having a source-drain path and a gate, said source-drain path of said enabling transistor connected between a reference potential and said common node, said gate of said enabling transistor connected to said program enable signal; and
   a first transistor of a second conductivity-type, said first transistor having a source-drain path and a gate, said source-drain path of said first transistor connected between said common node and said gates of said driver transistors, said gate of said first transistor connected to a virtual ground signal.

17. The method of claim 11, wherein said resistance is coupled to said gates of said driver transistors by a circuit including:
   a first transistor of said first conductivity-type, said first transistor having a source-drain path and a gate, said source-drain path of said first transistor connected between said gates of said driver transistors and said reference potential, said gate of said first transistor connected to a virtual ground signal.

18. The method of claim 11, wherein said resistance is coupled to said gates of said driver transistors by a circuit including:
   a first transistor of said first conductivity-type, said first transistor having a source-drain path and a gate, said source-drain path of said first transistor connected between said gate of said driver transistor and said reference potential, said gate of said first transistor connected to said program enable signal.

* * * * *